(12) United States Patent
Kim et al.

(10) Patent No.: US 10,330,278 B2
(45) Date of Patent: Jun. 25, 2019

(54) DEVICE FOR PREVENTING DEWING OF HEADLAMP

(71) Applicant: LG INNOTEK CO., LTD., Seoul (KR)

(72) Inventors: Ji Hoon Kim, Seoul (KR); Dong Kyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 75 days.

(21) Appl. No.: 15/562,734

(22) PCT Filed: Apr. 12, 2016

(86) PCT No.: PCT/KR2016/003838
§ 371 (c)(1),
(2) Date: Sep. 28, 2017

(87) PCT Pub. No.: WO2016/167540
PCT Pub. Date: Oct. 20, 2016

(65) Prior Publication Data
US 2018/0080620 A1    Mar. 22, 2018

(30) Foreign Application Priority Data

Apr. 13, 2015    (KR) .................. 10-2015-0052025

(51) Int. Cl.
*F21S 43/00*    (2018.01)
*F21S 45/33*    (2018.01)
(Continued)

(52) U.S. Cl.
CPC .............. *F21S 45/33* (2018.01); *F21S 43/00* (2018.01); *F21S 45/40* (2018.01); *F21S 45/43* (2018.01);
(Continued)

(58) Field of Classification Search
CPC .. F21S 45/33; F21S 45/40; F21S 45/60; F21S 45/43; F21S 45/435; F21S 43/00;
(Continued)

(56) References Cited

U.S. PATENT DOCUMENTS 4,849,865 A * 7/1989 Van Duyn ............... F21S 45/33
                                                        362/294
4,931,912 A * 6/1990 Kawakami ............ F21S 48/335
                                                        362/294
(Continued)

OTHER PUBLICATIONS

International Search Report in International Application No. PCT/KR2016/003838, filed Apr. 12, 2016.

*Primary Examiner* — Bao Q Truong
(74) *Attorney, Agent, or Firm* — Saliwanchik, Lloyd & Eisenschenk

(57) ABSTRACT

The present embodiment relates to a device for preventing dewing of headlamp, the device comprising: a housing, which has a light source provided therein, and which has a lens installed on a front end thereof; a thermoelectric module formed inside the housing such that, when power is supplied, one side thereof is heated, while another side surface thereof is cooled; a heat sink for radiating heat generated from the thermoelectric module;

a blowing fan formed behind the heat sink; and a blowing duct having a channel formed such that air, which is sent by the blowing fan, ascends along the inner surface of the lens.

10 Claims, 13 Drawing Sheets

(51) Int. Cl.
| | |
|---|---|
| *F21V 29/54* | (2015.01) |
| *F21V 29/90* | (2015.01) |
| *F21S 45/40* | (2018.01) |
| *F21S 45/43* | (2018.01) |
| *F21S 45/60* | (2018.01) |
| *F21S 45/435* | (2018.01) |
| *H01L 35/30* | (2006.01) |

(52) U.S. Cl.
CPC .............. *F21S 45/435* (2018.01); *F21S 45/60* (2018.01); *F21V 29/54* (2015.01); *F21V 29/90* (2015.01); *H01L 35/30* (2013.01)

(58) Field of Classification Search
CPC .......... F21S 45/42; F21V 29/54; F21V 29/90; F21V 29/60; F21V 29/502; F21V 29/504; F21V 29/50; H01L 35/30; B60Q 1/00; B60Q 1/04

See application file for complete search history.

(56) References Cited

U.S. PATENT DOCUMENTS

| | | | |
|---|---|---|---|
| 5,113,320 A * | 5/1992 | Haydu | B60Q 1/045 362/549 |
| 2010/0020563 A1 | 1/2010 | Ito et al. | |
| 2011/0051447 A1 | 3/2011 | Lee | |
| 2011/0310631 A1 | 12/2011 | Davis | |
| 2012/0038272 A1 | 2/2012 | De Castro | |
| 2015/0003096 A1 | 1/2015 | Shah et al. | |

* cited by examiner

WHEN HEADLAMP IS LIGHTED (TURNED ON)

WHEN HEADLAMP IS TURNED OFF

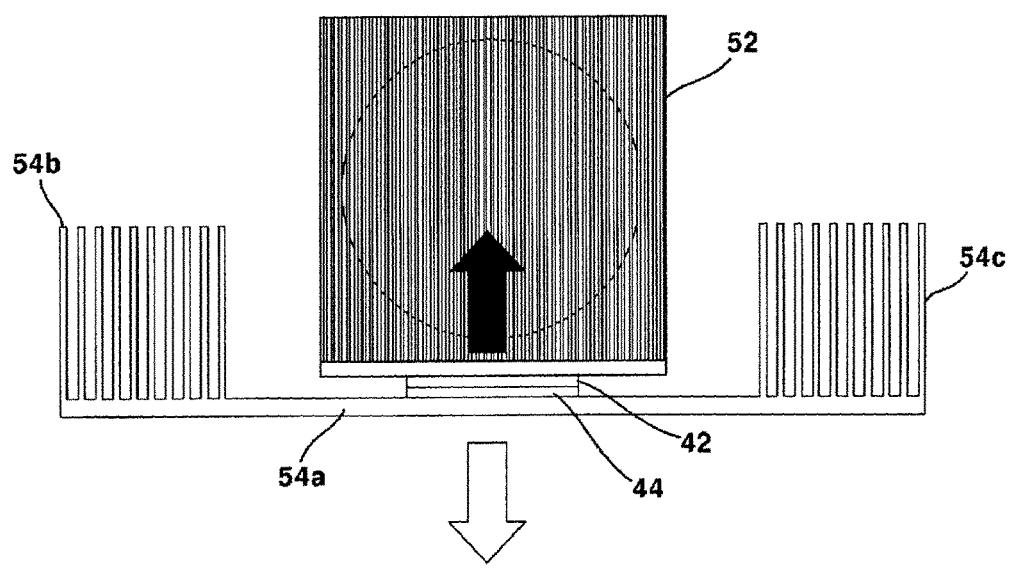

DEVICE FOR PREVENTING DEWING OF HEADLAMP

CROSS-REFERENCE TO RELATED APPLICATIONS

This application is the U.S. national stage application of International Patent Application No. PCT/KR2016/003838, filed Apr. 12, 2016, which claims priority to Korean Application No. 10-2015-0052025, filed Apr. 13, 2015, the disclosures of each of which are incorporated herein by reference in their entirety.

TECHNICAL FIELD

The teachings in accordance with the exemplary embodiments of this invention relate generally to a device for preventing dewing of headlamp.

BACKGROUND ART

A headlamp of a vehicle is used to illuminate a front side of the vehicle during operation of the vehicle, where the headlamp is disposed at an inside thereof with a light source, and an upper side or a lower side of the front of the vehicle is illuminated with a light emitted from the light source. The headlamp is laid in a high temperature environment caused by the light source itself of the headlamp and heat generated from an engine of the vehicle, and there is generated a difference between a temperature inside the headlamp and an outside of the vehicle, which causes generation of dewing inside the headlamp.

That is, as illustrated in FIG. 1(a), when the headlamp is initially lighted, a dew point temperature inside the headlamp is evaporated by a high temperature environment in response to the lighting of the headlamp to allow the headlamp to be in a temperature-increased state over an outside.

However, when a certain time lapses after light-off of the headlamp, higher and lower area temperatures inside the head lamp descend together to allow the dew point temperature to go down at the same time. At this time, a temperature reversal phenomenon is generated where an air descending speed at the lower area inside the headlamp is further increased over a descending speed of dew point temperature due to sealing treatment of the headlamp, to thereby generate moisture inside the headlamp.

The moisture generating problem inside the headlamp can create a defect on the light source of the headlamp and degrade the merchantability of a vehicle, which is recognized as a chronic problem in a vehicular headlamp system. In order to solve the aforesaid problem, various solutions have been proposed but the situation is that no fundamental solution has been made.

For example, although there is a dew prevention method in which an inner surface of a headlamp lens is coated with a dew prevention coating, or there is a dew prevention method using a silica gel, these methods are not fundamental solutions and create problems in life time, performances and reliability. Thus, necessity is required to fundamentally prevent the generation of dew.

DISCLOSURE

Technical Problem

The exemplary embodiments of the present invention are directed to solve the aforementioned problems, disadvantages or shortcomings, and to particularly provide a device for preventing dewing of headlamp to fundamentally prevent generation of dew in the headlamp.

Technical Solution

An object of the invention is to solve at least one or more of the above problems and/or disadvantages in whole or in part and to provide at least the advantages described hereinafter. In order to achieve at least the above objects, in whole or in part, and in accordance with the purposes of the invention, as embodied and broadly described, and in one general aspect of the present invention, there is provided a device for preventing dewing of headlamp, the device comprising:

a housing, which has a light source provided therein, and which has a lens installed on a front end thereof;

a thermoelectric module formed inside the housing such that, when power is supplied, one side thereof is heated, while another side surface thereof is cooled;

a heat sink for radiating heat generated from the thermoelectric module;

a blowing fan formed behind the heat sink; and a blowing duct having a channel formed such that air, which is sent by the blowing fan, ascends along the inner surface of the lens.

Preferably, but not necessarily, the heat sink may include a heating part heat sink formed by being in contact with one side surface of the thermoelectric module that is heated and a cooling part heat sink formed by being in contact with one side surface of the thermoelectric module that is cooled.

Preferably, but not necessarily, the blowing duct may be configured such that an inlet is formed in the shape of wrapping the heating part heat sink to allow the air blown from the heating part heat sink to be introduced thereinside.

Preferably, but not necessarily, an outlet of the blowing duct may be formed toward a bottom surface of the lens.

Preferably, but not necessarily, the blowing duct may be tapered off in width toward an outlet side from an inlet side.

Preferably, but not necessarily, a length of the outlet of the blowing duct may be same as a width of the lens.

Preferably, but not necessarily, a ratio between the width and the length of the outlet at the blowing duct may be 1:90~1:150.

Preferably, but not necessarily, the blowing fan may be formed by being in contact with the heating part heat sink.

Preferably, but not necessarily, the cooling part heat sink may include a panel contacting one side surface of the thermoelectric module that is cooled, and a plurality of radiation fins formed at both left and right lateral surfaces of the panel.

Preferably, but not necessarily, the device further comprises a bezel formed between the lens and the blowing duct to divide an inner space of the headlamp.

Advantageous Effects

The device for preventing dewing of headlamp according to exemplary embodiments of the present invention has an advantageous effect in that generation of dew is fundamentally prevented by increasing a temperature on a lens surface of the headlamp using an air heated by a thermoelectric module, whereby life span and performance can be greatly improved over the device for preventing dewing of headlamp according to prior art and to improve the reliability of the headlamp.

DESCRIPTION OF DRAWINGS

The teachings of the present invention can be readily understood by considering the following detailed description in conjunction with the accompanying drawings, in which:

FIG. 4(c) is a front view;

BEST MODE

In the following attached drawings, numerous specific details are set forth in order to provide a thorough understanding of the present invention. However, this disclosure may be embodied in many different forms and should not be construed as limited to any specific structure or function presented throughout this disclosure. Thus, the disclosure described herein is intended to embrace all such alternatives, modifications, variations and applications as may fall within the spirit and scope of the appended claims.

Now, an exemplary embodiment of the present disclosure will be explained in detail with reference to the accompanying drawings.

Figure 1A:
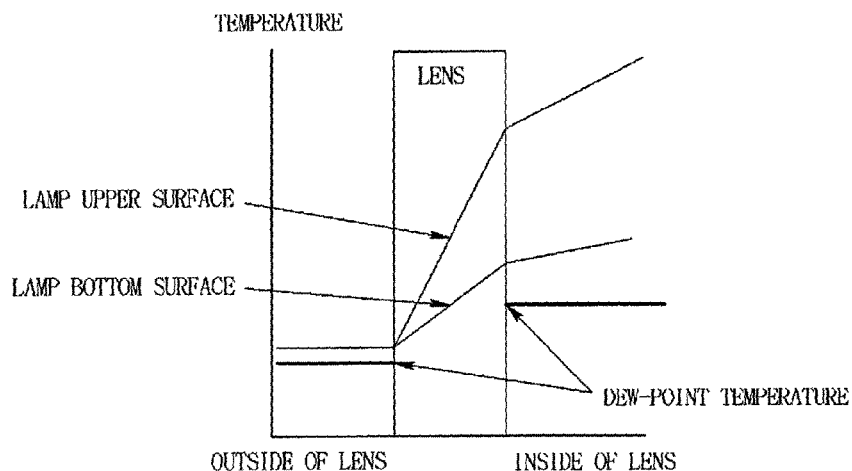
FIGS. 1(a) and 1(b) illustrate a graph explaining a dew generating principle on a headlamp.
Figure 1B:
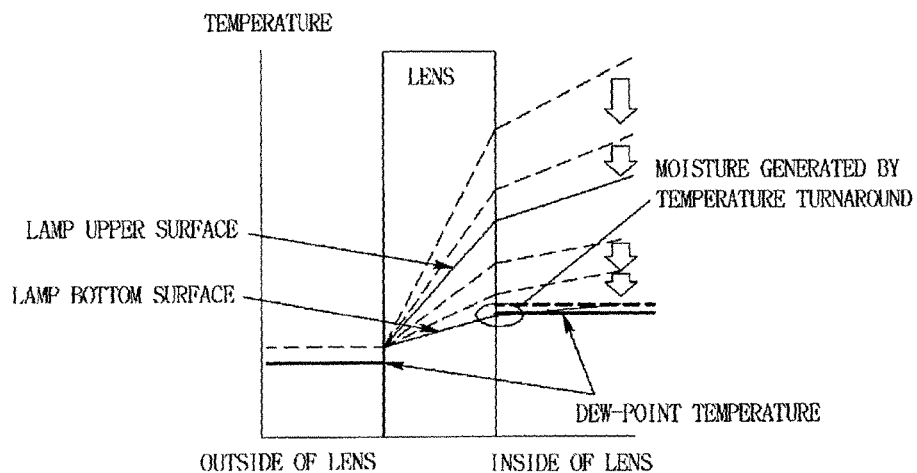
Figure 2:
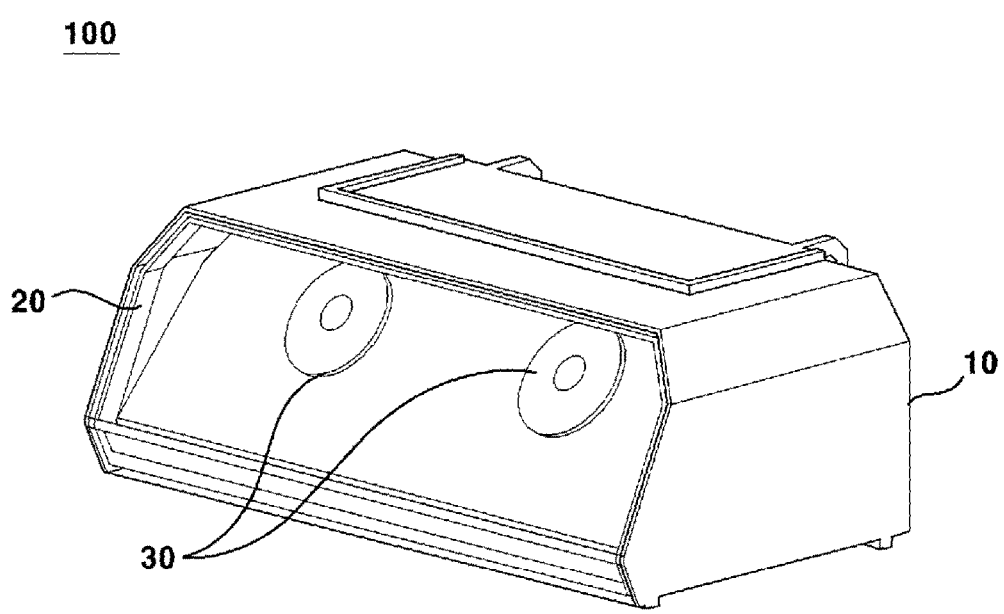
FIG. 2 illustrates an exterior look of a device for preventing dewing of headlamp according to an exemplary embodiment of the present invention.
Figure 3:
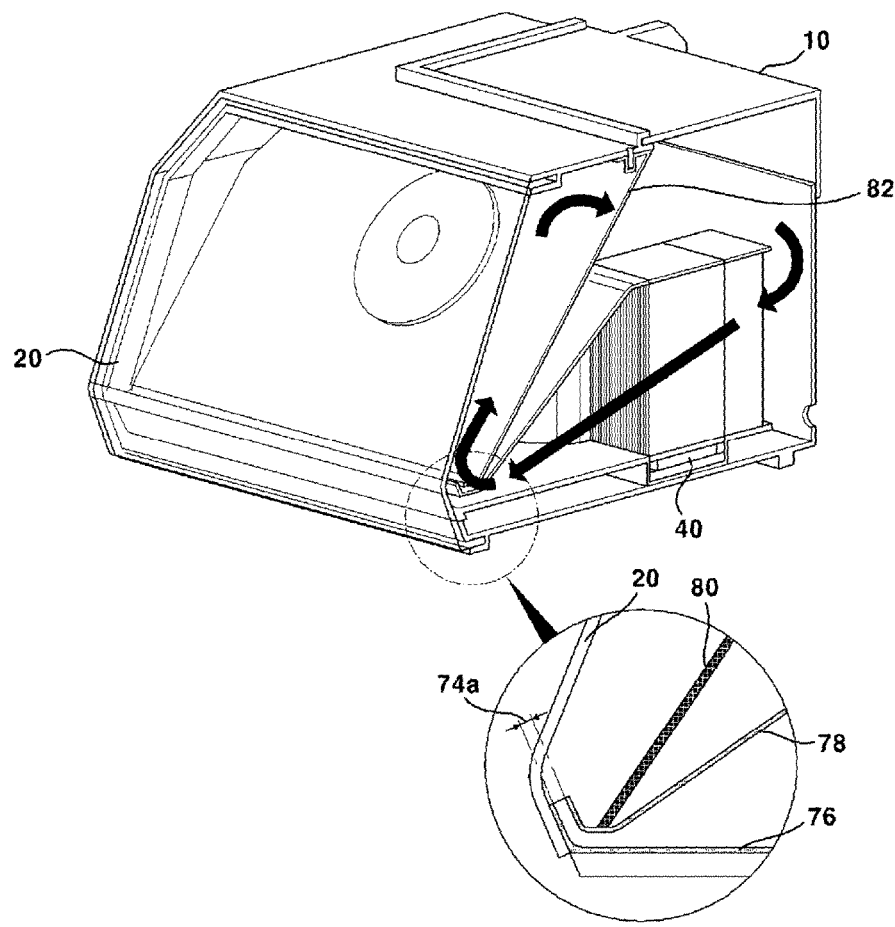
FIG. 3 is a perspective view cut at one portion of FIG. 2.
Figure 4A:
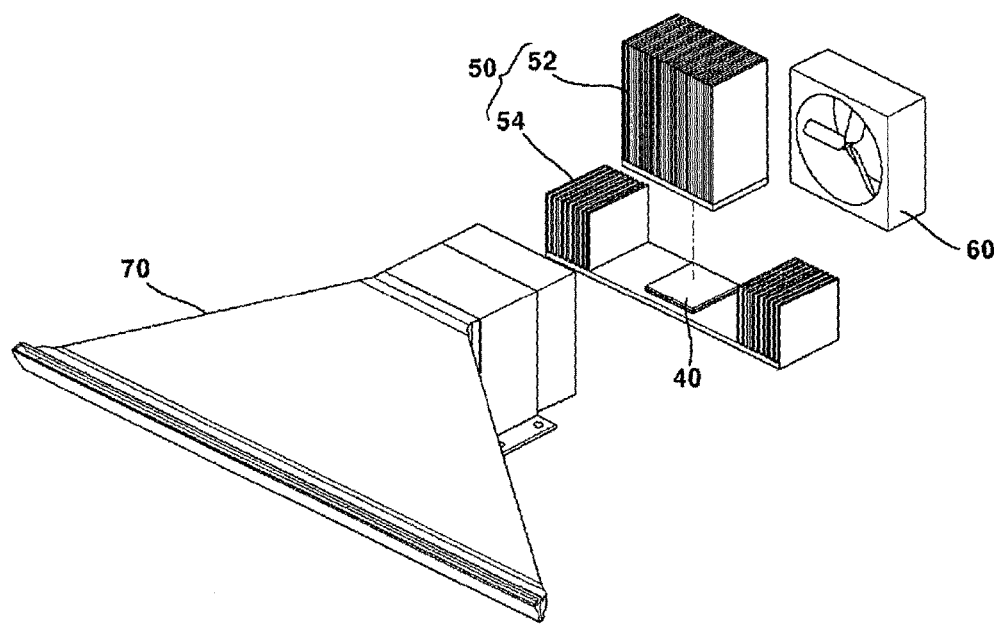
FIG. 4(a) is an exploded perspective view of an essential part of a device for preventing dewing of headlamp according to an exemplary embodiment of the present invention.
Figure 4B:
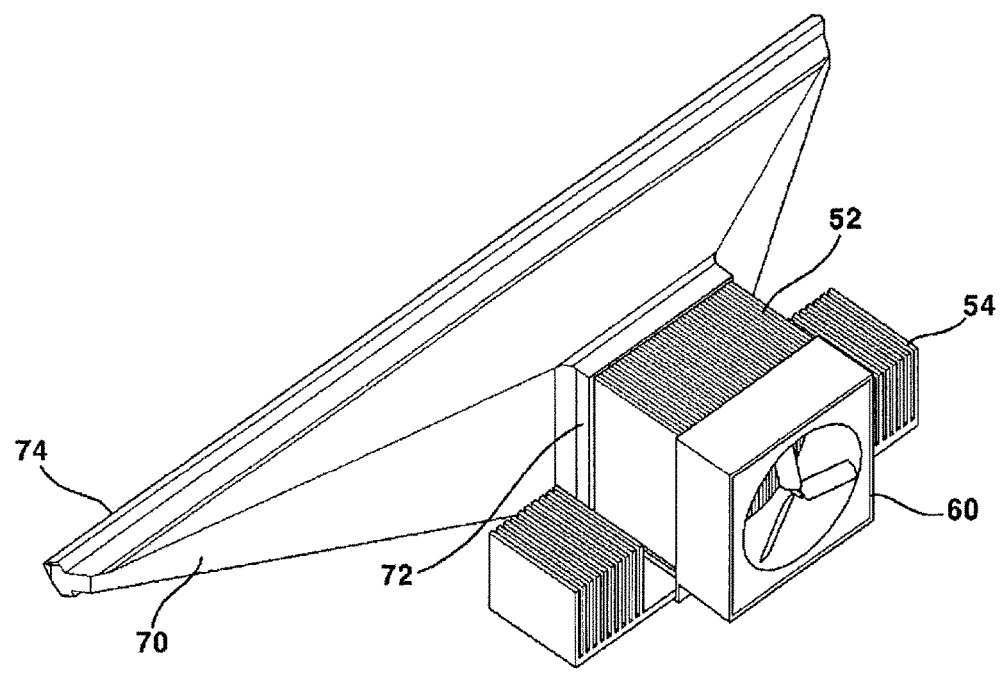
FIG. 4(b) is a perspective view.

FIG. 2 illustrates an exterior look of a device for preventing dewing of headlamp according to an exemplary embodiment of the present invention, FIG. 3 is a perspective view cut at one portion of FIG. 2, and FIG. 4(a) is an exploded perspective view of an essential part of a device for preventing dewing of headlamp according to an exemplary embodiment of the present invention, FIG. 4(b) is a perspective view, and FIG. 4(c) is a front view seen from a blowing fan side.

A headlamp (100) according to an exemplary embodiment of the present invention may include a housing forming an exterior look of the headlamp, a lens (20) formed to a direction of a front surface of the headlamp, and a light source (30) formed at an inside of the housing (10). The lens (20) may illuminate a light emitted from the light source to a front side. The light source (30) may be used with various light sources including halogen lamps, HID (High Intensity Discharged) lamps and LED (Light Emitting Diode) lamps, and the light source (30) can generate heat along with the light when lighted.

The housing (10) may include at an inner space a thermoelectric module (40), a heat sink (50), a blowing fan (60), a blowing duct (70) and a bezel (80). The bezel (80) may be slantly formed to divide the inner space of the housing by being connected to an upper portion and a lower portion of the housing (10). The bezel (80) may be mounted with the light source (30).

The thermoelectric module (40) may be mounted inside the housing (10). When an electric power is supplied to the thermoelectric module (40), a temperature at one side surface of the thermoelectric module (40) ascends, while a temperature at the other side surface descends. That is, the thermoelectric module (40) may be formed with a heat generating part (42) and a cooling part (44). A heat generating principle and detailed configuration of the thermoelectric module (40) will be described later.

The heat sink (50) may be installed by being manufactured with a material having an excellent heat transfer efficiency, and may be aligned with a plurality of thin heat generating fins in order to broaden a surface area. The heat sink (50) may be divided into a heating part heat sink (52) and a cooling part heat sink (54). The heating part heat sink (52) may be so installed as to contact an upper surface of the heat generating part (42) of the thermoelectric module (40) and may be heated by the heat generated from the heating part. When the heating part heat sink (52) is heated, an air passing through the heating part heat sink (52) may be heated together to increase the temperature at an inner surface of the lens (20). The cooling part heat sink (54) may be so formed as to contact a bottom surface of the cooling part (44) of the thermoelectric module (40). As illustrated in FIG. 4(c), a panel (54a) may be contacted by the cooling part (44) of the thermoelectric module (40), and a plurality of heating fins (54b, 54c) may be formed at left and right sides of the panel. The cooling part heat sink (54) functions to reduce a dew point by decreasing humidity by condensing the humidity inside the headlamp (100). Furthermore, when the cooling part heat sink (54) becomes in contact with the light source (30), the cooling part heat sink (54) may also perform a function of radiating the heat generated from a bottom surface light source (not shown).

The blowing fan (60) may be formed at a rear side of the thermoelectric module to blow out the air heated by the thermoelectric module (40) and the heat sink (50). It may be preferable that the blowing fan (60) is tightly formed at a rear side of the heating part heat sink (62) to prevent wind from being leaked. The blowing duct (70) may be so formed as to allow the heated air to flow along an inner surface of the lens. An inlet (72) of the blowing duct (70) may be connected to the heating part heat sink (52) lest the air heated by the heating part be leaked out and formed in a structure of wrapping the heating part heat sink (52), as shown in FIG. 4(b). Because the inlet (72) has a structure of wrapping the heating part heat sink (52), the inlet (72) is preferable to have the same shape (i.e., square shape) as that of the heating part heat sink (52) but the present invention is not limited thereto. The enlarged view of FIG. 3 may ascertain the structure of the blowing duct (70) more easily. A bottom surface of the blowing duct (70) may be formed in parallel with the housing, and an upper surface (78) of the blowing duct (70) may be slantly formed to allow a width of the blowing duct (70) to taper off from an inlet (72) side to an outlet (74) side. The degree of a width (74a) of outlet of the blowing duct being narrowed will be described later. A length (74b) of outlet (74) of the blowing duct (70) may be same or substantially same as a width of lens in order to allow the leaked-out air to be evenly dispersed on an inner surface of the lens.

Figure 5:
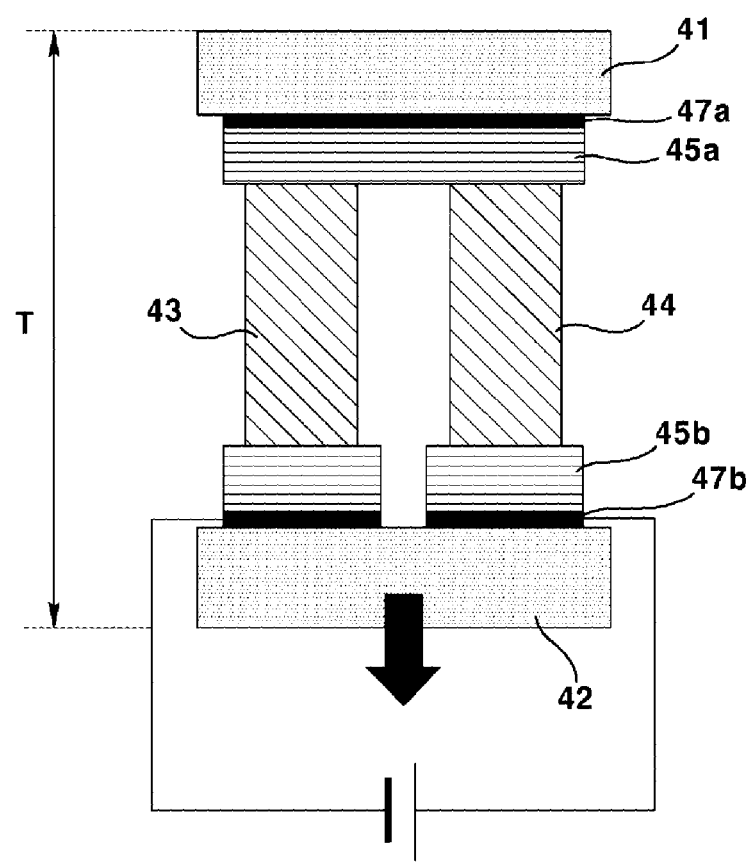
FIG. 5 is a cross-sectional view illustrating a thermoelectric element.
Figure 6:
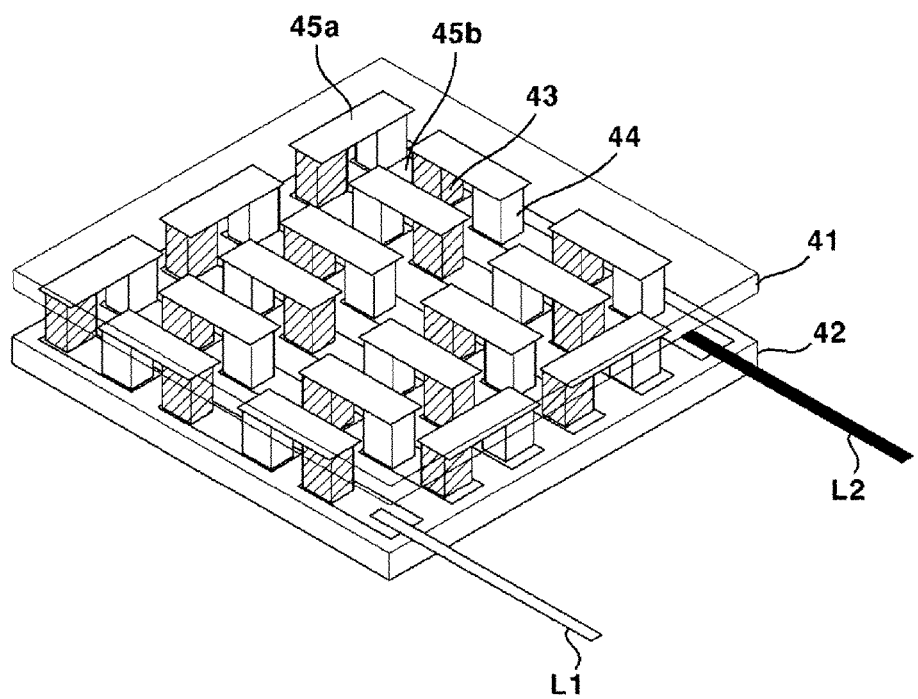
FIG. 6 is a schematic view illustrating a thermoelectric module (40) arranged with thermoelectric elements in a plural number.

FIG. 5 is a cross-sectional view illustrating a thermoelectric element, and FIG. 6 is a schematic view illustrating a thermoelectric module (40) arranged with thermoelectric elements in a plural number.

Referring to FIGS. 5 and 6, the thermoelectric module including with thermoelectric elements according to an exemplary embodiment of the present invention may be formed by including mutually oppositely formed first substrate (41) and second substrate (42), and at least one unit cell including a second semiconductor device (44) electrically connected to a first semiconductor device (43) formed between the first and second substrates (41, 42).

The first and second substrates (41, 42) may be used with an insulating substrate, for example, an alumina substrate, or a metal substrate as another example, to thereby realize heat suction and heating efficiency and an effect of minimizing the size. Of course, when the first and second substrates (41, 42) are formed with a metal substrate, it may be preferable that dielectric layers (47a, 47b) be further included between electrode layers (45a, 45b) formed between the first and second substrates (41, 42). The metal substrate may be applied with Cu or Cu alloy, and a size-minimizable thickness may be formed within a range of 0.1 mm-0.5 mm. When the thickness of metal substrate is thinner than 0.1 mm or thicker than 0.5 mm, the radiation characteristic becomes excessively high or the thermal conductivity becomes excessively high to greatly degrade the reliability of the thermoelectric module.

Furthermore, the dielectric layers (47a, 47b) are dielectric elements having a high radiation performance, and therefore use a material having a 5~10 W/K specific thermal conductivity in consideration of the specific thermal conductivity of cooling thermoelectric module, and the thickness may be within a range of 0.01 mm~0.15 mm. When the thickness is less than 0.01 mm, the specific thermal conductivity becomes reduced to degrade the radiation efficiency.

The electrode layers (45a, 45b) may use electrode materials such as Cu, Ag and Ni to electrically connect the first semiconductor device and the second semiconductor device, and when the illustrated unit cells are connected in a plural number, adjacent unit cells may be formed by being electrically connected as illustrated in FIG. 6. The thickness of electrode layer may be formed in a range of 0.01 mm~0.3 mm. When the thickness of the electrode layer is less than 0.01 mm, the function of the electrode deteriorates to make the electric conductivity defected and when the thickness of the electrode layer exceeds 0.3 mm, a resistance is increased to reduce the electric conductivity.

In this case, the thermoelectric elements forming the unit cells may be particularly applied with thermoelectric elements including stack-up typed structure of unit elements according to the exemplary embodiments of the present invention, where one side may be formed with P type semiconductor as the first semiconductor device (43) and with N type semiconductor as the second semiconductor device (44), and where the first semiconductor and the second semiconductor may be connected to metal electrodes (45a, 45b), and where a plurality of these structures are formed to realize a Peltier effect on the semiconductor devices by circuit lines (L1, L2) supplied with a current via the electrodes.

In addition, the semiconductor devices within the thermoelectric module of FIGS. 5 and 6 may be applied with P type semiconductor or N type semiconductor materials. In the P type semiconductor or the N type semiconductor material, the N type semiconductor may be formed using a main raw material comprising of BiTe including Se, Ni, Al, Cu, Ag, Pb, B, Ga, Te, Bi and In, and a mixture mixed with Bi or Te corresponding to 0.001~1.0 wt % of total weight of the main raw material. For example, the main raw material may be Bi—Se—Te material, and this main raw material may be added with a weight of Bi or Te corresponding to 0.001~1.0 wt % of total weight. That is, it is preferable that when a 100 g of Bi—Se—Te is inputted, an additionally mixed Bi or Te be within a range of 0.001 g~1.0 g. As discussed supra, the weight range of material added to the main raw material has a meaning in that the thermal conductivity is not reduced outside of the 0.001 wt %~0.1 wt % range, and the electric conductivity is reduced not to expect the improvement of ZT value.

The P type semiconductor material may be preferably formed by using a main raw material comprising of BiTe including Sb, Ni, Al, Cu, Ag, Pb, B, Ga, Te, Bi and In, and a mixture mixed with Bi or Te corresponding to 0.001~1.0 wt % of total weight of the main raw material. For example, the main raw material may be Bi—Sb—Te material, and this main raw material may be added with a weight of Bi or Te corresponding to 0.001~1.0 wt % of total weight. That is, it is preferable that when a 100 g of Bi—Sb—Te is inputted, an additionally mixed Bi or Te be within a range of 0.001 g~1 g. As discussed supra, the weight range of material added to the main raw material has a meaning in that the thermal conductivity is not reduced outside of the 0.001 wt %~0.1 wt % range, and the electric conductivity is reduced not to expect the improvement of ZT value.

The shape and size of mutually and oppositely formed first and second semiconductor devices that form the unit cells may be same, and in this case, in consideration of the fact that the electric conductivity characteristic of P type semiconductor and the electric conductivity characteristic of N type semiconductor are mutually different to act as a factor to reduce the cooling efficiency, a volume of any one side of semiconductor may be made to be different from a volume of mutually opposite other semiconductor to thereby improve cooling performances.

That is, the formation of differentiating the volume of mutually oppositely arranged semiconductor devices of unit cell may be largely realized by a method of differently forming an entire shape, forming a different diameter of cross-section of one side in a semiconductor device having a same height, or forming a different height or a different diameter of cross-section in a semiconductor device having the same shape. Particularly, a diameter of N type semiconductor device may be made greater than that of the P type semiconductor device to improve the thermoelectric efficiency by increasing the volume.

Hereinafter, operation of headlamp and principle of preventing the generation of dew in the headlamp according to an exemplary embodiment of the present invention will be described.

First, when an electric power is applied to the thermoelectric module (40), the heat generating part (42) of the thermoelectric module (40) is heated by the Peltier effect, while the cooling part (44) is cooled. As a result, the heating part heat sink (52) contacted to the heat generating part (42) at the thermoelectric module (40) may be heated, while the cooling part heat sink (54) contacted by the cooling part (44) at the thermoelectric module may be cooled.

Next, when the blowing fan (60) is rotated, the air inside the headlamp starts to be circulated. At this time, the air inside the headlamp is moved while forming a predetermined flow path along the blowing duct (70). The blowing duct (70) is designed to move along an inner surface of the lens (20), the air heated inside the heating part heat sink (52) is moved along the inner surface of the lens (20) to increase the temperature at the inner surface of the lens. The dewing (or dew condensation) can be prevented by maintaining a temperature over a dew point by increasing a temperature at an inner surface of the lens, and as a result, the generated dews can be removed. At this time, the air cooled by the cooling part heat sink (54) can condense the humidity inside the headlamp to decrease the humidity, whereby the dew point can be decreased.

Figure 7A:
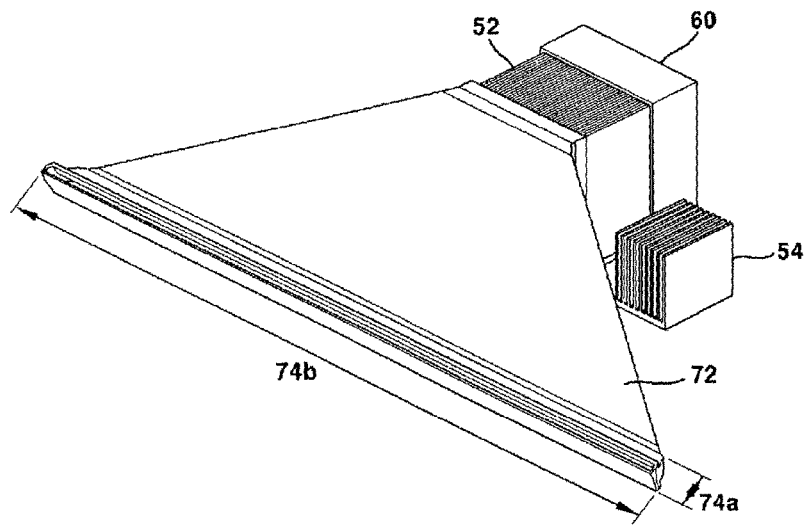
FIGS. 7(a) and 7(b) are schematic views illustrating a minimum inflow amount in response to a ratio between a length and a width of an outlet at a blowing duct according to an exemplary embodiment of the present invention.
Figure 7B:
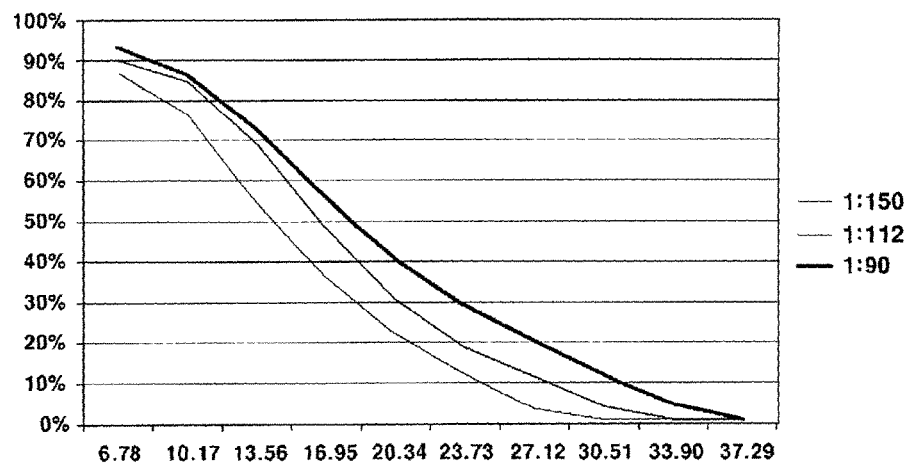

FIGS. 7(a) and 7(b) are schematic views illustrating a minimum inflow amount in response to a ratio between a length (74b) and a width (74a) (hereinafter referred as "aspect ratio") of an outlet at a blowing duct (70) according to an exemplary embodiment of the present invention.

As discussed in the above explanation, the width of blowing duct is tapered off toward the outlet side and the narrowing degree may be variably designed. That is, although the length (74b) of the outlet is fixed, the width (74a) may be variably designed. However, it is preferable that the design change be made within a predetermined range. The aspect ratio is preferably of approximately 1:90~1:150. At this time, the length (74b) of the outlet may be formed in the same or similar manner as the width of the lens to make the length determined at a predetermined size, such that when the aspect ratio is made smaller, the width (74a) of the outlet is made narrower, and when the aspect ratio is made greater, the width (74a) of the outlet is made greater. Thus, when the width (74a) of the outlet is excessively narrowed, the flow resistance is made to increase, and when the width (74a) of the outlet is excessively increased, a blowing fan with a greater output capacity may be required in order to comply with a minimum inflow amount.

Thus, it is preferable that the aspect ratio be adequately adjusted within the above range. For example, when the aspect ratio at the outlet is narrowed to a 1:80 degree, a length at a width of the outlet becomes excessively narrowed to problematically increase the flow resistance, and when the aspect ratio is increased to a level of 1:160, a blowing fan with a greater capacity must be used to increase the cost. The following Table 1 indicates a minimum inflow amount in order to prevent dewing in response to a width and a length of an outlet.

TABLE 1

| Aspect ratio at outlet of blowing duct | Minimum inflow amount (CFM) |
|---|---|
| 1:90 | 37.29 |
| 1:112 | 33.90 |
| 1:150 | 30.51 |

As noted from the above Table 1, when the aspect ratio increases, that is, when a width (74a) at the outlet increases, it can be ascertained that the minimum inflow amount required for dewing prevention is reduced. Of course, the minimum inflow amount is a minimum air amount required to prevent the dewing of the headlamp, such that there is no problem if more amount of air is introduced, but an output of the blowing fan must be increased in order to introduce an excessive amount of air. When the output of the blowing fan is increased, the cost may be increased, such that it is important that an adequate output of blowing fan be used in consideration of a minimum inflow amount required for prevention of dewing in the headlamp.

Figure 8A:
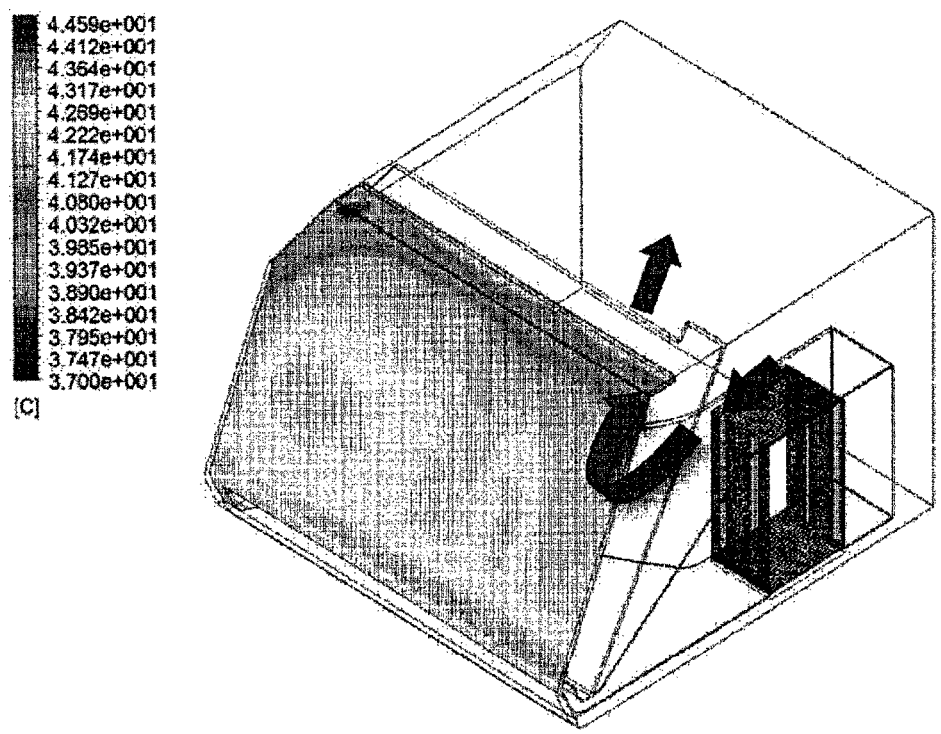
FIGS. 8(a) through 8(d) are schematic views illustrating a simulation result of a device for preventing dewing of headlamp according to an exemplary embodiment of the present invention.
Figure 8B:
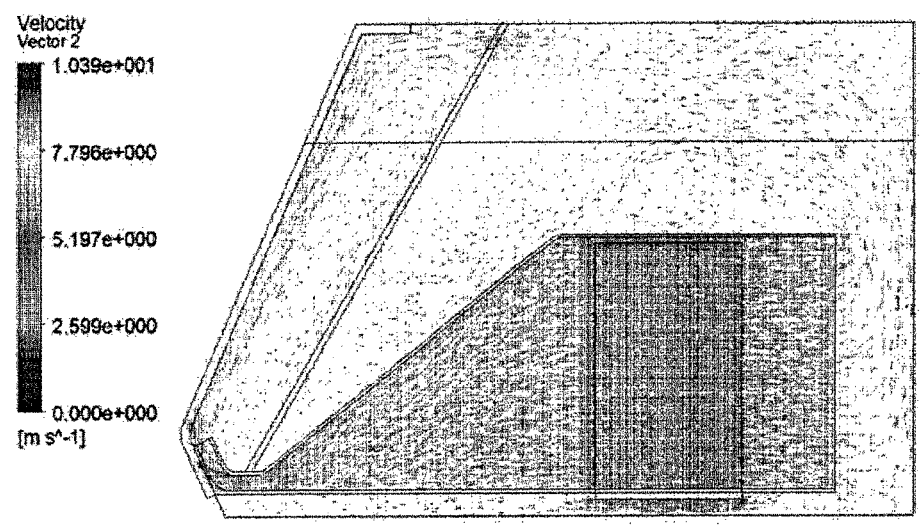
Figure 8C:
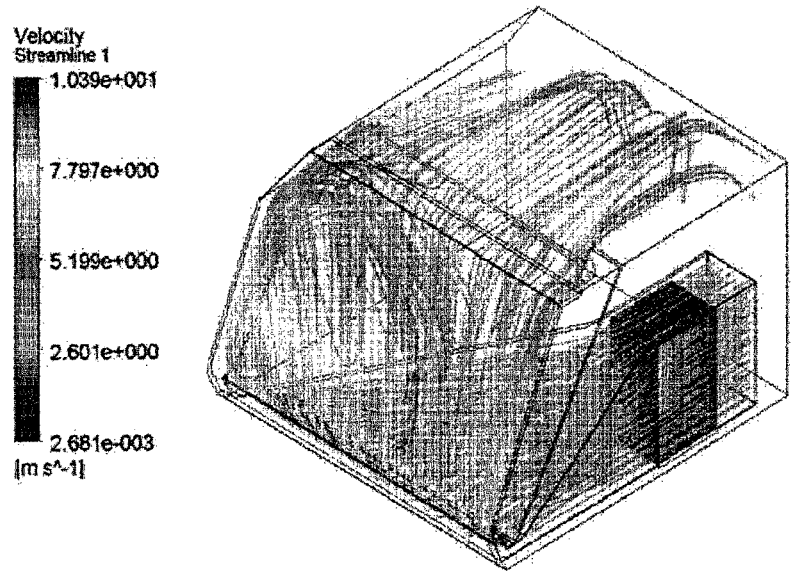
Figure 8D:
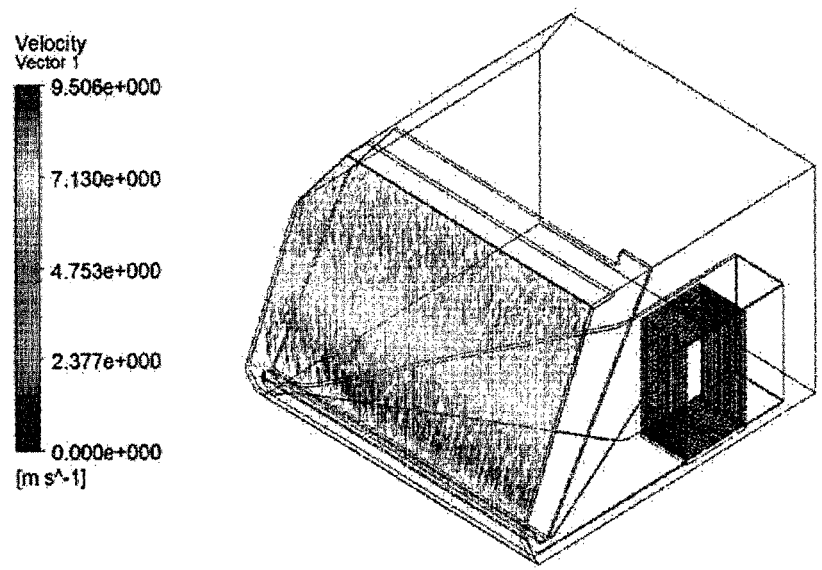

FIGS. 8(a) through 8(d) are schematic views illustrating a simulation result of a device for preventing dewing of headlamp according to an exemplary embodiment of the present invention, where FIG. 8(a) illustrates a temperature at an inner surface of a lens, FIGS. 8(b) and 8(c) illustrate an air flow, and FIG. 8(d) illustrates a flow speed of air.

FIGS. 8(b) and 8(c) illustrate air flow, where FIG. 8(b) illustrates an arrow for showing a direction the air is moving, and FIG. 8(c) illustrates an air flow path where air flows are connected by lines.

As noted from a result of the above simulation, it can be ascertained from the present invention that an air heated by the heat sink rises along an inner surface of a lens to simultaneously increase a temperature at an inner surface of the lens. Furthermore, a flow speed at a bottom surface of the lens is relatively higher than that of an upper surface of the lens.

Figure 9A:
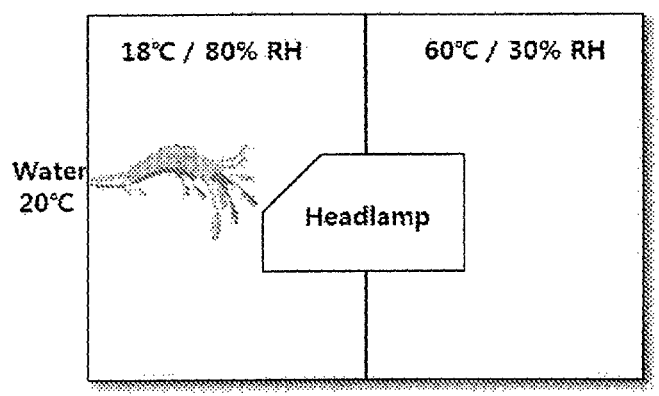
FIGS. 9(a) and 9(b) are schematic views illustrating an experimental environment and a result of a device for preventing dewing of headlamp according to an exemplary embodiment of the present invention.
Figure 9B:
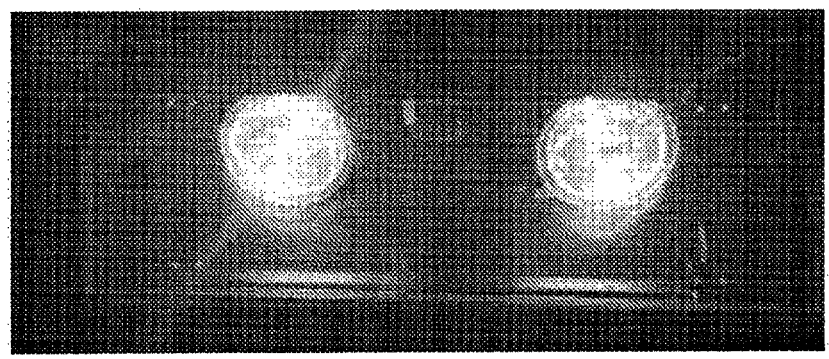

FIGS. 9(a) and 9(b) are schematic views illustrating an experimental environment and a result of a device for preventing dewing of headlamp according to an exemplary embodiment of the present invention, where FIG. 9(a) schematically illustrates an experimental environment, and FIG. 9(b) illustrates a result of the experiment.

In the experiment, the headlamp was activated for 10 minutes to allow the temperature inside the headlamp to be maintained at 60° C., and to allow the humidity to be maintained at 30%, and water of 20° C. was sprayed from outside to allow the temperature and the humidity at 18° C. and 80% respectively. As a result of the experiment, even if there was generated a temperature difference between inside and outside of the headlamp, it could be ascertained that no dewing was generated.

While the present invention has been particularly shown and described with reference to exemplary embodiments thereof, the general inventive concept is not limited to the above-described embodiments. It will be understood by those of ordinary skill in the art that various changes and variations in form and details may be made therein without departing from the spirit and scope of the present invention as defined by the following claims.

The invention claimed is:

1. A device for preventing dewing of headlamp, the device comprising:
   a housing, which has a light source provided therein, and which has a lens installed on a front end thereof;
   a thermoelectric module formed inside the housing such that, when power is supplied, one side thereof is heated, while another side surface thereof is cooled;
   a heat sink for radiating heat generated from the thermoelectric module;
   a blowing fan formed behind the heat sink; and
   a blowing duct having a channel formed such that air, which is sent by the blowing fan, ascends along the inner surface of the lens.

2. The device of claim 1, wherein the heat sink includes a heating part heat sink formed by being in contact with one side surface of the thermoelectric module that is heated and a cooling part heat sink formed by being in contact with one side surface of the thermoelectric module that is cooled.

3. The device of claim 2, wherein the blowing duct is configured such that an inlet is formed in the shape of wrapping the heating part heat sink to allow the air blown from the heating part heat sink to be introduced thereinside.

4. The device of claim 2, wherein an outlet of the blowing duct is formed toward a lower portion of the lens.

5. The device of claim 4, wherein the blowing duct is tapered off in width toward an outlet side from an inlet side.

6. The device of claim 4, wherein a length of the outlet of the blowing duct is same as a width of the lens.

7. The device of claim 6, wherein a ratio between the width and the length of the outlet at the blowing duct is 1:90~1:150.

8. The device of claim 2, wherein the blowing fan is formed by icing in contact with the heating part heat sink.

9. The device of claim 2, wherein the cooling part heat sink includes a panel contacting one side surface of the thermoelectric module that is cooled, and a plurality of radiation fins formed at both left and right lateral surfaces of the panel.

10. The device of claim 1, further comprising a bezel formed between the lens and the blowing duct to divide an inner space of the headlamp.

* * * * *